United States Patent
Camillo-Castillo et al.

(10) Patent No.: US 9,224,858 B1
(45) Date of Patent: Dec. 29, 2015

(54) LATERAL DOUBLE-DIFFUSED METAL OXIDE SEMICONDUCTOR FIELD EFFECT TRANSISTOR (LDMOSFET) WITH A BELOW SOURCE ISOLATION REGION AND A METHOD OF FORMING THE LDMOSFET

(71) Applicant: International Business Machines Corporation, Armonk, NY (US)

(72) Inventors: Renata Camillo-Castillo, Essex Junction, VT (US); Santosh Sharma, Essex Junction, VT (US); Yun Shi, South Burlington, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/445,101

(22) Filed: Jul. 29, 2014

(51) Int. Cl.
| | | |
|---|---|---|
| H01L 29/78 | (2006.01) | |
| H01L 29/66 | (2006.01) | |
| H01L 29/10 | (2006.01) | |
| H01L 29/08 | (2006.01) | |
| H01L 29/06 | (2006.01) | |
| H01L 21/762 | (2006.01) | |
| H01L 21/306 | (2006.01) | |

(52) U.S. Cl.
CPC ...... *H01L 29/7816* (2013.01); *H01L 21/30604* (2013.01); *H01L 21/76224* (2013.01); *H01L 29/0649* (2013.01); *H01L 29/0865* (2013.01); *H01L 29/0882* (2013.01); *H01L 29/1095* (2013.01); *H01L 29/66659* (2013.01); *H01L 29/66681* (2013.01); *H01L 29/7835* (2013.01)

(58) Field of Classification Search
None
See application file for complete search history.

(56) References Cited

U.S. PATENT DOCUMENTS

| 6,165,890 A | 12/2000 | Kohl et al. |
|---|---|---|
| 6,642,557 B2 | 11/2003 | Liang |
| 7,851,832 B2 | 12/2010 | Takagi |
| 8,067,290 B2 | 11/2011 | Boeck et al. |

(Continued)

FOREIGN PATENT DOCUMENTS

| JP | 2007-123823 | 5/2007 |
|---|---|---|
| KR | 10-2011-0078879 A | 7/2011 |

OTHER PUBLICATIONS

Jeon et al., "Buried Air Gap Structure for Improving the Breakdown Voltage of SOI Power MOSFET's", School of Electrical Eng., Seoul Nat'l Univ., Shinlim-Dong Kwanak-Ku, Seoul 151-742, Korea, pp. 1061-1063.

(Continued)

*Primary Examiner* — Daniel Luke
(74) *Attorney, Agent, or Firm* — Gibb & Riley, LLC; Michael J. LeStrange, Esq.

(57) ABSTRACT

Disclosed are a field effect transistor (FET) (e.g., a lateral double-diffused metal oxide semiconductor field effect transistor (LDMOSFET)) and a method of forming the FET. In the FET, an etch stop pad is on a semiconductor substrate (e.g., a P-type silicon substrate). A semiconductor layer (e.g., a silicon layer) is also on the substrate and extends laterally over the etch stop pad. A first well region (e.g., an N-well region) extends through the semiconductor layer into the substrate such that it contains the etch stop pad. A second well region (e.g., a P-well region) is in the first well region aligned above the etch stop pad. A source region (e.g., a N-type source region) is in the second well region. A buried isolation region (e.g., a buried air-gap isolation region) is within the first well region aligned below the etch stop pad so as to limit vertical capacitor formation.

20 Claims, 11 Drawing Sheets

(56) References Cited

U.S. PATENT DOCUMENTS

| | | | |
|---|---|---|---|
| 8,278,710 | B2 | 10/2012 | Khemka et al. |
| 8,598,660 | B2 | 12/2013 | Camillo-Castillo et al. |
| 8,608,376 | B2 | 12/2013 | Kashyap et al. |
| 8,610,211 | B2 | 12/2013 | Furukawa et al. |
| 8,664,078 | B2 | 3/2014 | Miyairi |
| 2002/0053695 | A1 | 5/2002 | Liaw et al. |
| 2005/0199907 | A1 | 9/2005 | Divakaruni et al. |
| 2005/0212087 | A1 | 9/2005 | Akatsu et al. |
| 2006/0258077 | A1 | 11/2006 | Kunnen |
| 2007/0275537 | A1 | 11/2007 | Henson et al. |
| 2011/0140170 | A1 | 6/2011 | Dove |
| 2011/0260245 | A1 | 10/2011 | Liu et al. |
| 2011/0315526 | A1 | 12/2011 | Jahnes et al. |
| 2012/0091524 | A1 | 4/2012 | Zhang et al. |
| 2012/0264275 | A1 | 10/2012 | Abadeer et al. |
| 2013/0256784 | A1 | 10/2013 | Vellianitis et al. |
| 2015/0041893 | A1* | 2/2015 | Wang et al. .............. 257/339 |

OTHER PUBLICATIONS

Mahabadi et al., "A New Partial SOI-LDMOSFET with a Modified Buried Oxide Layer for Improving Self-Heating and Breakdown Voltage", Semiconductor Science and Technology, vol. 26, No. 9, 2011, Abstract.

* cited by examiner

US 9,224,858 B1

LATERAL DOUBLE-DIFFUSED METAL OXIDE SEMICONDUCTOR FIELD EFFECT TRANSISTOR (LDMOSFET) WITH A BELOW SOURCE ISOLATION REGION AND A METHOD OF FORMING THE LDMOSFET

BACKGROUND

The structures and methods disclosed herein relate to lateral double-diffused metal oxide semiconductor field effect transistors (LDMOSFETS) and, more particularly, to an LDMOSFET with a below-source isolation region (e.g., a below-source air-gap isolation region) for reduced parasitic capacitance and a method of forming the LDMOSFET.

Typically, a lateral double-diffused metal oxide semiconductor field effect transistor (LDMOSFET), like a conventional MOSFET, comprises a channel region positioned laterally between a source region and a drain region. However, unlike the conventional MOSFET, the LDMOSFET is asymmetrical. Specifically, the drain region (e.g., an N-type drain region) of the LDMOSFET is separated from the channel region by a relatively low-doped drain drift region (e.g., an N-type drain drift region with a lower conductivity level than the drain region), which provides ballasting resistance so that the LDMOSFET has a relatively high blocking voltage (i.e., a high maximum voltage that can be applied to the transistor). To form such an LDMOSFET structure on a bulk semiconductor substrate (e.g., on a P-type semiconductor substrate), the source region (e.g., an N$^+$ source region) is typically formed above multiple well regions with different type conductivities (e.g., above a P-well region that is above an N-well region that is above a lower portion of the P-type semiconductor substrate). In combination, these well regions and the semiconductor substrate form a vertical capacitor (e.g., a PNP capacitor) that turns on during switching of the LDMOSFET, generating parasitic capacitance and, thereby causing power loss. Therefore, there is a need in the art for an LDMOSFET with reduced parasitic capacitance and a method of forming the LDMOSFET.

SUMMARY

In view of the foregoing, disclosed herein is a field effect transistor (FET) (e.g., a lateral double-diffused metal oxide semiconductor field effect transistor (LDMOSFET)). The FET can comprise an etch stop pad on a semiconductor substrate (e.g., a P-type silicon substrate). A semiconductor layer (e.g., a silicon layer) can also be on the semiconductor substrate and can extend laterally over the etch stop pad. A first well region (e.g., an N-well region) can extend through the semiconductor layer into the semiconductor substrate such that it contains the etch stop pad. A second well region (e.g., a P-well region) can be in the first well region aligned above the etch stop pad. A source region (e.g., a N-type source region) can be in the second well region at the top surface of the semiconductor layer. A buried isolation region (e.g., a buried air-gap isolation region) can be positioned within the lower portion of the first well region in the semiconductor substrate and, specifically, can be aligned just below the etch stop pad in order to limit vertical capacitor formation (e.g., vertical PNP capacitor formation) between the second well region, the first well region and the semiconductor substrate and, thereby reduce parasitic capacitance. Also disclosed herein is a method of forming the FET.

More particularly, disclosed herein is a field effect transistor (FET) (e.g., a lateral double-diffused metal oxide semiconductor field effect transistor (LDMOSFET)). This FET can comprise a semiconductor substrate having a first type conductivity and, on the semiconductor substrate, an etch stop pad and a semiconductor layer that is positioned laterally immediately adjacent to the etch stop pad and that further extends over the etch stop pad.

The FET can further comprise a first well region, a second well region, a source region and a drain region. The first well region can have a second type conductivity different from the first type conductivity and can extend from a top surface of the semiconductor layer into the semiconductor substrate below such that the etch stop pad is contained therein. The second well region can have the same type conductivity as the semiconductor substrate (i.e., the first type conductivity), can be within the first well region at the top surface of the semiconductor layer, and can be aligned above the etch stop pad. Both the source region and the drain region can have the same type conductivity as the first well region (i.e., the second type conductivity), but at a higher conductivity level. The source region can be within the second well region at the top surface of the semiconductor layer and the drain region can be within the first well region at the top surface of the semiconductor layer and separated from the second well region.

The FET can further comprise a buried isolation region within the lower portion of the first well region in the semiconductor substrate and aligned below the etch stop pad. This buried isolation region can comprise, for example, a buried air-gap isolation region. This buried isolation region limits vertical capacitor formation between the second well region, the first well region and the semiconductor substrate and, thereby reduces parasitic capacitance.

One exemplary field effect transistor (FET) (e.g., one exemplary lateral double-diffused metal oxide semiconductor field effect transistor (LDMOSFET)) disclosed herein can comprise a silicon substrate having a P-type conductivity and, on the silicon substrate, an etch stop pad and a silicon layer that is positioned laterally immediately adjacent to the etch stop pad and that further extends over the etch stop pad.

The FET can further comprise a first well region, a second well region, a source region and a drain region. The first well region can have an N-type conductivity and can extend from a top surface of the silicon layer into the silicon substrate below such that the etch stop pad is contained therein. The second well region can have the same type conductivity as the silicon substrate (i.e., P-type conductivity), can be within the first well region at the top surface of the silicon layer, and can be aligned above the etch stop pad. Both the source region and the drain region can have the same type conductivity as the first well region (i.e., N-type conductivity), but at a higher conductivity level. The source region can be within the second well region at the top surface of the silicon layer and the drain region can be within the first well region at the top surface of the silicon layer and separated from the second well region.

The FET can further comprise a buried isolation region within the lower portion of the first well region in the silicon substrate and aligned below the etch stop pad. This buried isolation region can comprise, for example, a buried air-gap isolation region. This buried isolation region limits vertical capacitor formation and, particularly, PNP vertical capacitor formation between the second well region, the first well region and the silicon substrate and, thereby reduces parasitic capacitance.

Also disclosed herein is a method of forming a field effect transistor (FET) (e.g., a lateral double-diffused metal oxide semiconductor field effect transistor (LDMOSFET)). This method can comprise providing a semiconductor substrate having a first type conductivity. An etch stop pad can be formed on the semiconductor substrate and, after the etch stop pad is formed, a semiconductor layer can be formed on the semiconductor substrate such that it is positioned laterally adjacent to the etch stop pad and such that it further extends over the etch stop pad.

Then, multiple well regions can be formed. Specifically, a first well region can be formed such that it has a second type conductivity that is different from the first type conductivity, such that it extends from a top surface of the semiconductor layer into the semiconductor substrate below, and such that it contains the etch stop pad. A second well region can also be formed such that it has the same type conductivity as the semiconductor substrate (i.e., the first type conductivity) at a higher conductivity level, such that it is within the first well region at the top surface of the semiconductor layer, and such that it is aligned above the etch stop pad.

A gate structure can be formed on the top surface of the semiconductor layer such that it is above the first well region and such that it overlaps an edge portion of the second well region. After the gate structure is formed, a source region and a drain region can be formed so that they each have the same type conductivity as the first well region (i.e., the second type conductivity) at a higher conductivity level. Specifically, the source region can be formed within the second well region at the top surface of the semiconductor layer adjacent to a first sidewall of the gate structure and the drain region can be formed within the first well region at the top surface of the semiconductor layer adjacent to a second sidewall of the gate structure opposite the first sidewall.

Additionally, a buried isolation region (e.g., a buried air-gap isolation region) can be formed within the first well region such that it is aligned below the etch stop pad in order to limit vertical capacitor formation between the second well region, the first well region and the semiconductor substrate and, thereby reduce parasitic capacitance.

One exemplary method of forming a field effect transistor (FET) (e.g., a lateral double-diffused metal oxide semiconductor field effect transistor (LDMOSFET)) can specifically comprise providing a silicon substrate having a P-type conductivity. An etch stop pad can be formed on the silicon substrate and, after the etch stop pad is formed, a silicon layer can be formed on the silicon substrate such that it is positioned laterally adjacent to the etch stop pad and such that it further extends over the etch stop pad.

Then, multiple well regions can be formed. Specifically, a first well region can be formed such that it has an N-type conductivity, such that it extends from a top surface of the silicon layer into the silicon substrate below, and such that it contains the etch stop pad. A second well region can also be formed such that it has the same type conductivity as the silicon substrate (i.e., P-type conductivity) at a higher conductivity level, such that it is within the first well region at the top surface of the silicon layer, and such that it is aligned above the etch stop pad.

A gate structure can be formed on the top surface of the silicon layer such that it is above the first well region and such that it overlaps an edge portion of the second well region. After the gate structure is formed, a source region and a drain region can be formed so that they each have the same type conductivity as the first well region (i.e., N-type conductivity) at a higher conductivity level. Specifically, the source region can be formed within the second well region at the top surface of the silicon layer adjacent to a first sidewall of the gate structure and the drain region can be formed within the first well region at the top surface of the silicon layer adjacent to a second sidewall of the gate structure opposite the first sidewall.

Additionally, a buried isolation region (e.g., a buried air-gap isolation region) can be formed within the first well region such that it is aligned below the etch stop pad in order to limit vertical capacitor formation and, particularly, vertical PNP capacitor formation, between the second well region, the first well region and the silicon substrate and, thereby reduce parasitic capacitance.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
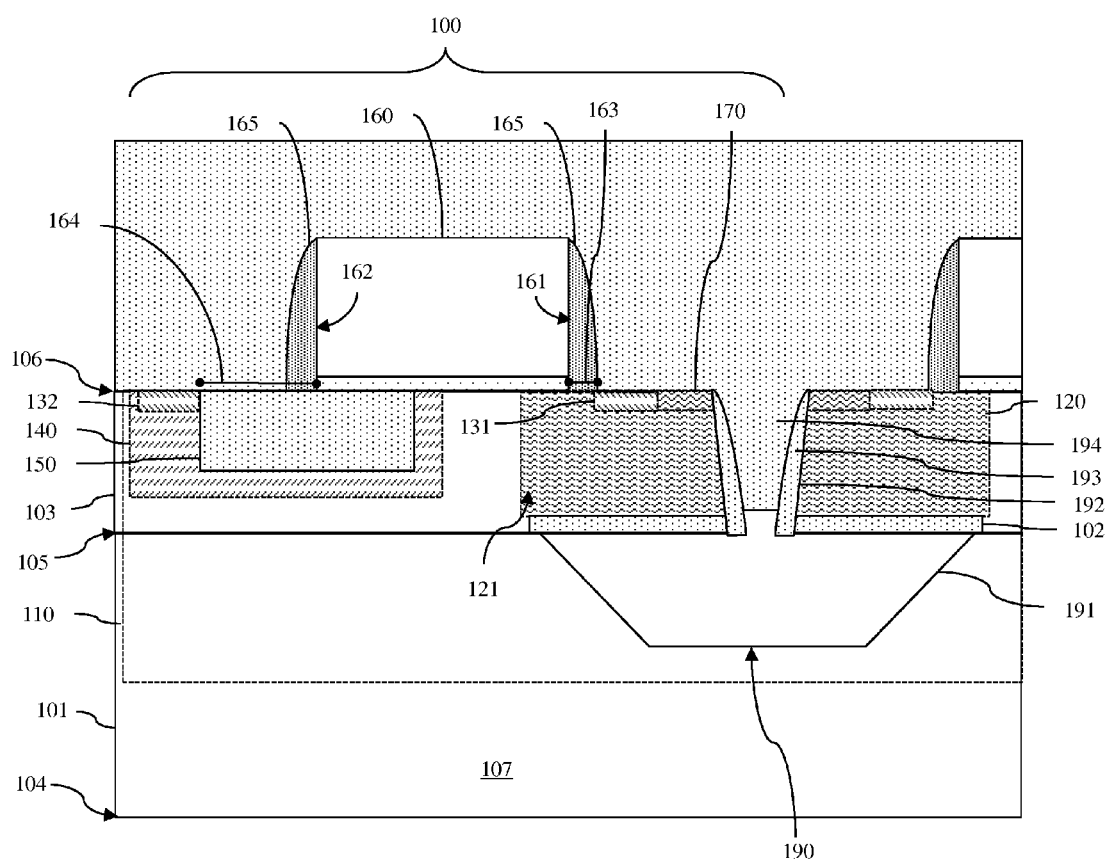
FIG. 1 is a cross-section diagram illustrating a lateral double-diffused metal oxide semiconductor field effect transistor with a below-source isolation region.

As mentioned above, a lateral double-diffused metal oxide semiconductor field effect transistor (LDMOSFET), like a conventional MOSFET, comprises a channel region positioned laterally between a source region and a drain region. However, unlike the conventional MOSFET, the LDMOS- FET is asymmetrical. Specifically, the drain region (e.g., an N-type drain region) of the LDMOSFET is separated from the channel region by a relatively low-doped drain drift region (e.g., an N-type drain drift region with a lower conductivity level than the drain region), which provides ballasting resistance so that the LDMOSFET has a relatively high blocking voltage (i.e., a high maximum voltage that can be applied to the transistor). To form such an LDMOSFET structure on a bulk semiconductor substrate (e.g., a P-type semiconductor substrate), the source region (e.g., an N+ source region) is typically formed above multiple well regions with different type conductivities (e.g., above a P-well region that is above an N-well region that is above a lower portion of the P-type semiconductor substrate). In combination, these well regions and the semiconductor substrate form a vertical capacitor (e.g., a PNP capacitor) that turns on during switching of the LDMOSFET, generating parasitic capacitance and, thereby causing power loss.

In view of the foregoing, disclosed herein is a field effect transistor (FET) (e.g., a lateral double-diffused metal oxide semiconductor field effect transistor (LDMOSFET)). The FET can comprise an etch stop pad on a semiconductor substrate (e.g., a P-type silicon substrate). A semiconductor layer (e.g., a silicon layer) can also be on the semiconductor substrate and can extend laterally over the etch stop pad. A first well region (e.g., an N-well region) can extend through the semiconductor layer into the semiconductor substrate such that it contains the etch stop pad. A second well region (e.g., a P-well region) can be in the first well region aligned above the etch stop pad. A source region (e.g., a N-type source region) can be in the second well region at the top surface of the semiconductor layer. A buried isolation region (e.g., a buried air-gap isolation region) can be positioned within the lower portion of the first well region in the semiconductor substrate and, specifically, can be aligned just below the etch stop pad in order to limit vertical capacitor formation (e.g., vertical PNP capacitor formation) between the second well region, the first well region and the semiconductor substrate and, thereby reduce parasitic capacitance. Also disclosed herein is a method of forming the FET.

More particularly, referring to FIG. 1, disclosed herein is a field effect transistor (FET) 100 and, particularly, a lateral double-diffused metal oxide semiconductor field effect transistor (LDMOSFET)) with a below-source isolation region (e.g., a below-source air-gap isolation) for reduced parasitic capacitance.

This FET 100 can comprise a bulk semiconductor substrate 101 comprising, for example, a silicon substrate or any other suitable semiconductor substrate (e.g., a germanium substrate, a gallium arsenide substrate, a gallium nitride substrate, etc.). In any case, the semiconductor substrate 101 can have a first type conductivity at a relatively low conductivity level.

For purposes of illustration, the first type conductivity will be referred to herein as P-type conductivity and the second type conductivity will be referred to herein as N-type conductivity. However, it should be understood that, alternatively, the first type conductivity could be N-type conductivity and the second type conductivity could be P-type conductivity. Those skilled in the art will recognize that different dopants can be used to achieve the different type conductivities (i.e., P-type conductivity and N-type conductivity) and that those dopants vary depending upon the different semiconductor materials used. For example, a silicon-based semiconductor material can be doped with arsenic (As), phosphorous (P) or antimony (Sb) so as to have N-type conductivity or can be doped with boron (B), boron difluoride ($BF_2$) or indium (In) so as to have P-type conductivity. In another example, a gallium arsenide (GaAs) or gallium nitride (GaN)-based semiconductor material can be doped with silicon (Si) so as to have N-type conductivity or can be doped with magnesium (Mg) or beryllium (Be) so as to have P-type conductivity. Additionally, those skilled in the art will also recognize that the higher the concentration of the particular dopant used, the higher the conductivity level associated with that dopant and vice versa. Furthermore, the different conductivity types and levels will depend upon the relative concentration levels of different type dopants in the same region.

Thus, for example, the semiconductor substrate 101 can be doped with a first type dopant (e.g., a P-type dopant) such that it has the first type conductivity (e.g., such that it comprises a P-type substrate).

In any case, the FET 100 can further comprise an etch stop pad 102 on the top surface 105 of the semiconductor substrate 101. As discussed in greater detail below with regard to the method, the etch stop pad 102 can comprise an etch stop layer, which is formed on the top surface 105 of the semiconductor substrate 101 and which is subsequently patterned into a pad (e.g., a rectangular-shaped pad) that only covers a designated area of the semiconductor substrate 101. The material used to form this etch stop pad 102 can be preselected so that the semiconductor substrate 101 below can be selectively etched over the etch stop pad 102 during subsequent processing. For example, if the semiconductor substrate 101 comprises a silicon substrate, the material used to form the etch stop pad 102 can comprise either a dielectric material, such as silicon dioxide, silicon nitride, silicon oxynitride, etc., or a semiconductor material that is different from silicon (e.g., silicon germanium) because silicon can be selectively etched over such materials. That is, if the semiconductor substrate 101 comprises a silicon substrate, the etch stop pad 102 can comprise any of a dielectric pad (e.g., a silicon dioxide pad, a silicon nitride pad, a silicon oxynitride pad), a silicon germanium pad, or a pad formed of any other suitable material that etches at a relatively slow etch rate as compared to silicon.

The FET 100 can further comprise a semiconductor layer 103 on the top surface 105 of the semiconductor substrate 101 positioned laterally immediately adjacent to the etch stop pad 102 and further extending over and covering the etch stop pad 102. This semiconductor layer 103 can comprise, for example, the same semiconductor material as in the semiconductor substrate 101 or, alternatively, a different semiconductor material than that of the semiconductor substrate 101. Thus, for example, if the semiconductor substrate 101 comprises a silicon substrate, the semiconductor layer 103 can comprise a silicon layer or, alternatively, a silicon germanium layer, a silicon carbide layer, a silicon germanium carbide layer, or any other suitable semiconductor layer. As discussed in greater detail below with regard to the method, this semiconductor layer 103 can be formed on the semiconductor substrate 101 and over the etch stop pad 102 by epitaxial deposition. Those skilled in the art will recognize that, as a result of such an epitaxial deposition process, different sections of the semiconductor layer 103 may have different crystalline structures depending upon the crystalline structures of the semiconductor substrate 101 and the etch stop pad 102. For example, if the semiconductor substrate 101 comprises a monocrystalline silicon substrate and the etch stop pad 102 comprises a dielectric pad, the resulting semiconductor layer 103 may have monocrystalline and polycrystalline sections above the monocrystalline silicon substrate 101 and etch stop pad 102, respectively. However, if the semiconductor substrate 101 comprises a monocrystalline silicon substrate and the etch stop pad comprises a monocrystalline silicon germanium pad, the semiconductor layer 103 may be entirely monocrystalline in structure.

The FET 100 can further comprise a first well region 110, a second well region 120, a source region 131, a drain region 132 and a contact region 170.

The first well region 110 can be doped with a second type dopant (e.g., an N-type dopant) such that it has a second type conductivity (e.g., N-type conductivity), which is different from the first type conductivity. Thus, the first well region 110 can comprise, for example, an N-well region. The first well region 110 can extend from the top surface 106 of the semiconductor layer 103 to a predetermined depth within the semiconductor substrate 101 such that the etch stop pad 102 is contained in that first well region 110. Additionally, the predetermined depth of the first well region 110 within the semiconductor substrate 101 can be some distance above the bottom surface 104 of the semiconductor substrate 101 such that a lower portion 107 of the semiconductor substrate 101, having the first type conductivity (e.g., P-type conductivity), is between the bottom surface 104 of the semiconductor substrate 101 and the first well region 110.

The second well region 120 can be doped with a first type dopant (e.g., a P-type dopant) such that it has the first type conductivity (e.g., P-type conductivity) at a higher conductivity level than the lower portion 107 of the semiconductor substrate 101. The first type dopant can be the same dopant used in the semiconductor substrate 101 or a different dopant. Thus, the second well region 120 can comprise, for example, a P-well region. The second well region 120 can be within the first well region 110 and, particularly, in an upper portion of the first well region 110 in the semiconductor layer 103. Specifically, within the first well region 110, the second well region 120 can extend from the top surface 106 of the semiconductor layer 103 to a predetermined depth within the semiconductor layer 103, can be aligned above the etch stop pad 102 and can have approximately the same area (i.e., length and width) as the etch stop pad 102.

The source region 131 and the drain region 132 can each be doped with a second type dopant (e.g., an N-type dopant) so as to have the second type conductivity (e.g., N-type conductivity), but at a higher conductivity level that the first well region 110. The second type dopant can be the same second type dopant used for the first well region or a different second type dopant. Thus, for example, the source region 131 and drain region 132 can comprise N+ source/drain regions. The contact region 170 can have the first type conductivity, but at a higher conductivity level than the second well region 120. Thus, for example, the contact region 170 can comprise a P+ contact region. The source region 131 and the contact region 170 can be within the second well region 120 at the top surface 106 of the semiconductor layer 103 and, thereby aligned above the etch stop pad 102. The drain region 132 can be within the first well region 110 at the top surface 106 of the semiconductor layer 103 and can be separated from the second well region 120. The source region 131, the drain region 132 and contact region 170 can each extend into the semiconductor layer 103 to a shallower depth than the second well region 120.

The FET 100 can further comprise a gate structure 160 on the top surface 106 of the semiconductor layer 103 between the source region 131 and the drain region 132. The gate structure 160 can have a first sidewall 161 adjacent to the source region 131 and a second sidewall 162 opposite the first sidewall 161 and adjacent to the drain region 132. The source region 131 can specifically be positioned laterally between the contact region 170 and the first sidewall 161 of the gate structure 160. The gate structure 160 can comprise a gate dielectric layer and a gate conductor layer stacked above the gate dielectric layer.

It should be understood that, although a single gate dielectric layer and a single gate conductor layer are illustrated, the gate dielectric layer can comprise one or more gate dielectric materials and the gate conductor layer can comprise one or more different gate conductor materials. The gate dielectric material(s) can comprise, for example, any one or more of the following: silicon dioxide, silicon nitride, silicon oxynitride, and/or any other suitable gate dielectric material(s) including, but not limited to, a high-K gate dielectric such as a hafnium (HO-based gate dielectric (e.g., hafnium oxide, hafnium silicon oxide, hafnium silicon oxynitride, hafnium aluminum oxide, etc.) or some other suitable high-K gate dielectric (e.g., aluminum oxide, tantalum oxide, zirconium oxide, etc.). The gate conductor material(s) can comprise, for example, any one or more of the following: doped polysilicon, a metal, a metal alloy and/or any other suitable gate conductor material(s). Those skilled in the art will recognize that the different gate conductor material(s) may vary depending upon the conductivity type of the FET 100. For example, for an N-type field effect transistor, the gate conductor layer can comprise an N-doped polysilicon layer and/or a stack of one or more metals and/or metal alloys having a work function similar to N-doped polysilicon (e.g., hafnium, zirconium, titanium, tantalum, aluminum, and alloys thereof, such as, hafnium carbide, zirconium carbide, titanium carbide, tantalum carbide, and aluminum carbide). For a P-type field effect transistor, the gate conductor layer can comprise a P-doped polysilicon layer and/or a stack of one or more metals and/or metal alloys having a work function similar to P-doped polysilicon (e.g., ruthenium, palladium, platinum, cobalt, and nickel, as well as metal oxides, such as aluminum carbon oxide, aluminum titanium carbon oxide, etc., and metal nitrides, such as titanium nitride, titanium silicon nitride, tantalum silicon nitride, titanium aluminum nitride, tantalum aluminum nitride, etc.).

Gate sidewall spacers 165 can be positioned on the opposing sidewalls of the gate structure 160 (i.e., on the first sidewall 161 and the second sidewall 162). The gate sidewall spacers 165 can comprise one or more dielectric layers comprising any of silicon dioxide, silicon nitride, silicon oxynitride, air-gaps, etc.

Since, as mentioned above, the FET 100 can comprise a LDMOSFET, the positioning of the source region 131 and the drain region 132 relative to the gate structure 160 can be asymmetric. That is, the first sidewall 161 of the gate structure 160 can be a first distance 163 from the source region 131, the second sidewall 162 of the gate structure 160 can be a second distance 164 from the drain region 132 and the second distance 164 can be greater than the first distance 163. The first distance 163 can, for example, be approximately equal to the thickness of the gate sidewall spacers 165. Additionally, the FET 100 can further comprise a third well region 140 and, particularly, a defined drain drift region in the first well region 110. The third well region 140 can be doped with a second type dopant (e.g., a N-type dopant) such that it has the second type conductivity (e.g., N-type conductivity) at a lower conductivity level than the drain region 132, but at a higher conductivity level than the first well region 110. This second type dopant can be either the same second type dopant or a different second type dopant than that used in the first well region 110 and/or the source and drain regions 131-132. The third well region 140 can be at the top surface 106 of the semiconductor layer 103, can contain and be deeper than the drain region 132 and can extend laterally below the gate structure 160 toward, without abutting, the second well region 120. Such a drain drift region provides ballasting resistance so that the LDMOSFET has a relatively high blocking voltage (i.e., a high maximum voltage that can be applied to the transistor).

Optionally, the FET 100 can further comprise a trench isolation region 150 in the third well region 140 at the top surface 106 of the semiconductor layer 103. The trench isolation region 150 can be positioned so as to have one side positioned immediately adjacent to the drain region 132 and an opposite side extending laterally below the gate structure 160 toward, without extending laterally beyond (i.e., without contacting), a boundary between the third well region 140 and the first well region 110. The trench isolation region 150 can comprise, for example, a conventional shallow trench isolation region comprising a trench in the semiconductor layer 103 and filled with one or more isolation materials (e.g., silicon dioxide, silicon nitride, silicon oxynitride, and/or any other suitable isolation material).

The FET 100 can further comprise a buried isolation region 190 within the lower portion of the first well region 110 in the semiconductor substrate 101 and aligned below the etch stop pad 102. Specifically, an opening 192 can extend from the top surface 106 of the semiconductor layer 103 through the second well region 120 and etch stop pad 102 to the top surface 105 of the semiconductor substrate 101. A cavity 191 can be in the lower portion of the first well region 110 within the semiconductor substrate 101 and, specifically, can be centered below and wider than the opening 192 such that it is aligned below the etch stop pad 102. A protective liner 193 (e.g., a silicon dioxide liner or a silicon nitride liner) can line the walls of the opening 192 and one or more isolation layers 194 can at least plug the opening 192 so as to form the buried isolation region 190 within the cavity 191. Specifically, the isolation layer(s) 194 can comprise one or more of layers of silicon dioxide, silicon nitride, silicon oxynitride, borophosphosilicate glass (BPSG), etc. The isolation layer(s) 194 can fill both the cavity 191 and the opening 192. Alternatively, as illustrated, the isolation layer(s) 194 can pinch off in the opening 192, thereby plugging the opening 192 and leaving the cavity 191 filled with air alone (as shown) or a combination of air and isolation layer(s) such that the resulting buried isolation region 190 comprises a buried air-gap isolation region. In any case, this buried isolation region 190 limits vertical capacitor formation (e.g., vertical PNP capacitor formation) between the second well region 120, the first well region 110 and the lower portion 107 of the semiconductor substrate 101 and, thereby reduces parasitic capacitance that can result in power loss during switching.

Figure 2:
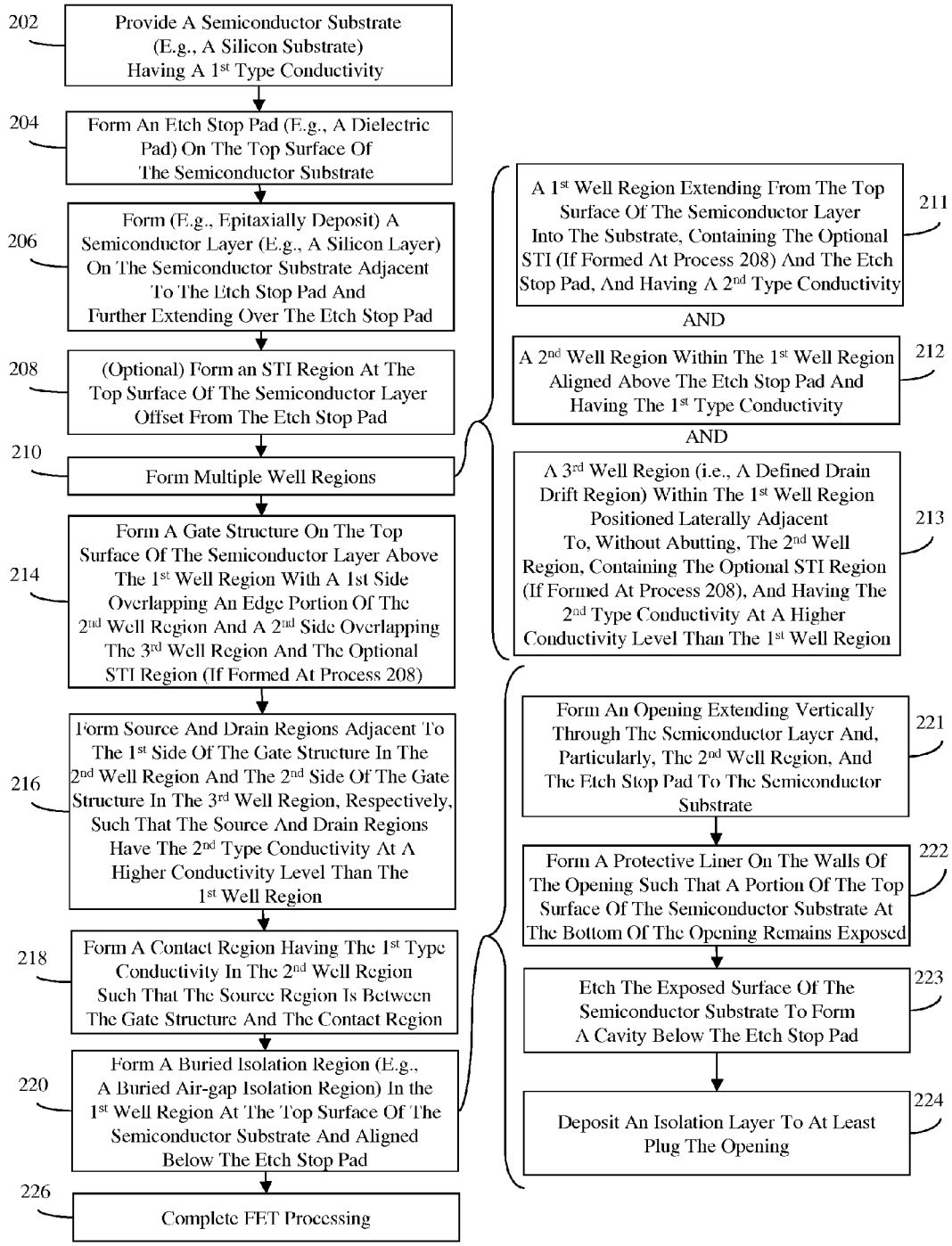
FIG. 2 is a flow diagram illustrating a method of forming the lateral double-diffused metal oxide semiconductor field effect transistor of FIG. 1.

Referring to FIG. 2, also disclosed herein is a method of forming a field effect transistor (FET) (e.g., a lateral double-diffused metal oxide semiconductor field effect transistor (LDMOSFET)) with a below-source isolation region (e.g., a below-source air-gap isolation region) for reduced parasitic capacitance.

Figure 3:
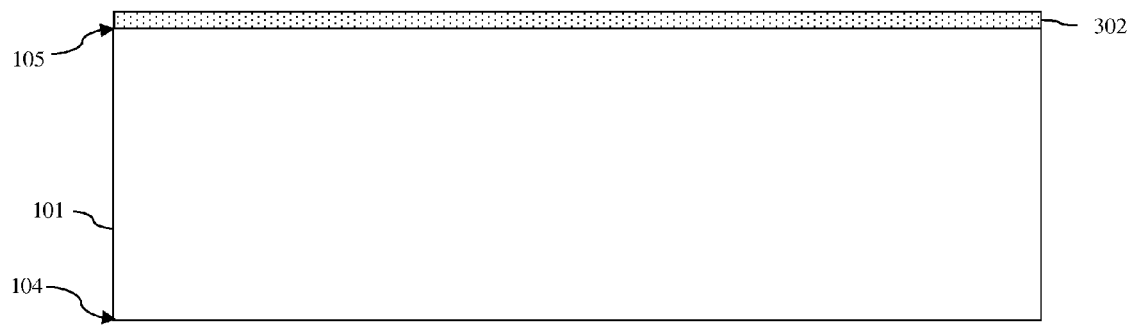
FIG. 3 is a cross-section diagram illustrating a partially completed lateral double-diffused metal oxide semiconductor field effect transistor formed according to the method of FIG. 2.

This method can comprise providing a semiconductor substrate 101 having a first type conductivity at a relatively low conductivity level (202, see FIG. 3). This semiconductor substrate 101 can comprise, for example, a silicon substrate or any other suitable semiconductor substrate (e.g., a germanium substrate, a gallium arsenide substrate, a gallium nitride substrate, etc.).

For purposes of illustration, the first type conductivity will be referred to herein as P-type conductivity and the second type conductivity will be referred to herein as N-type conductivity. However, it should be understood that, alternatively, the first type conductivity could be N-type conductivity and the second type conductivity could be P-type conductivity. Those skilled in the art will recognize that different dopants can be used to achieve the different type conductivities (i.e., P-type conductivity and N-type conductivity) and that those dopants vary depending upon the different semiconductor materials used. For example, a silicon-based semiconductor material can be doped with arsenic (As), phosphorous (P) or antimony (Sb) so as to have N-type conductivity or can be doped with boron (B), boron difluoride ($BF_2$) or indium (In) so as to have P-type conductivity. In another example, a gallium arsenide (GaAs) or gallium nitride (GaN)-based semiconductor material can be doped with silicon (Si) so as to have N-type conductivity or can be doped with magnesium (Mg) or beryllium (Be) so as to have P-type conductivity. Additionally, those skilled in the art will also recognize that the higher the concentration of the particular dopant used, the higher the conductivity level associated with that dopant and vice versa. Furthermore, the different conductivity types and levels will depend upon the relative concentration levels of different type dopants in the same region.

Thus, for example, the semiconductor substrate 101 can be doped with a first type dopant (e.g., a P-type dopant) such that it comprises comprise a P-type substrate (e.g., a P-silicon substrate).

Figure 4:
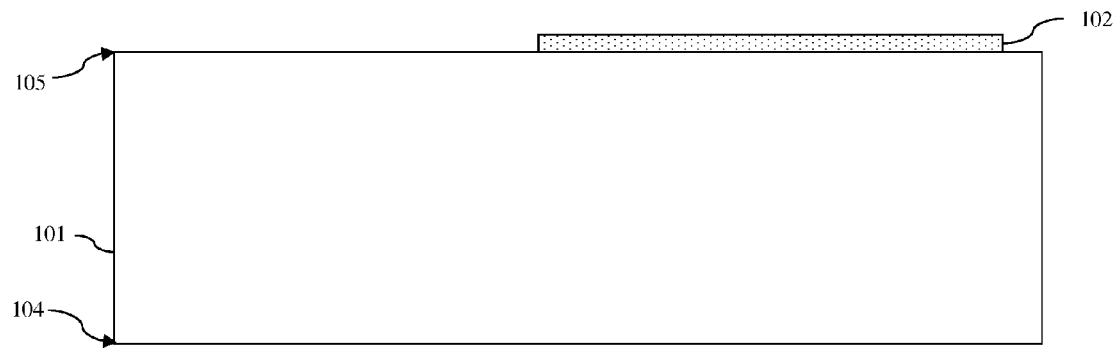
FIG. 4 is a cross-section diagram illustrating a partially completed lateral double-diffused metal oxide semiconductor field effect transistor formed according to the method of FIG. 2.

An etch stop pad can be formed on the top surface 105 of the semiconductor substrate 101 (204). Specifically, an etch stop layer 302 can be deposited onto the top surface 105 of the semiconductor substrate 101 (see FIG. 3). This etch stop layer 302 can comprise a material preselected so that the semiconductor substrate 101 below can be selectively etched over the etch stop pad 102 during subsequent processing (see process step 222 discussed in detail below). For example, if the semiconductor substrate 101 comprises a silicon substrate, the etch stop layer material can comprise either a dielectric material, such as silicon dioxide, silicon nitride, silicon oxynitride, etc., or a semiconductor material that is different from silicon (e.g., silicon germanium) because silicon can be selectively etched over such materials. After the etch stop layer 302 is deposited, it can be lithographically patterned and etched to form an etch stop pad 102 (e.g., an essentially rectangular-shaped pad) above a designated area of the semiconductor substrate 101 (see FIG. 4).

Figure 5:
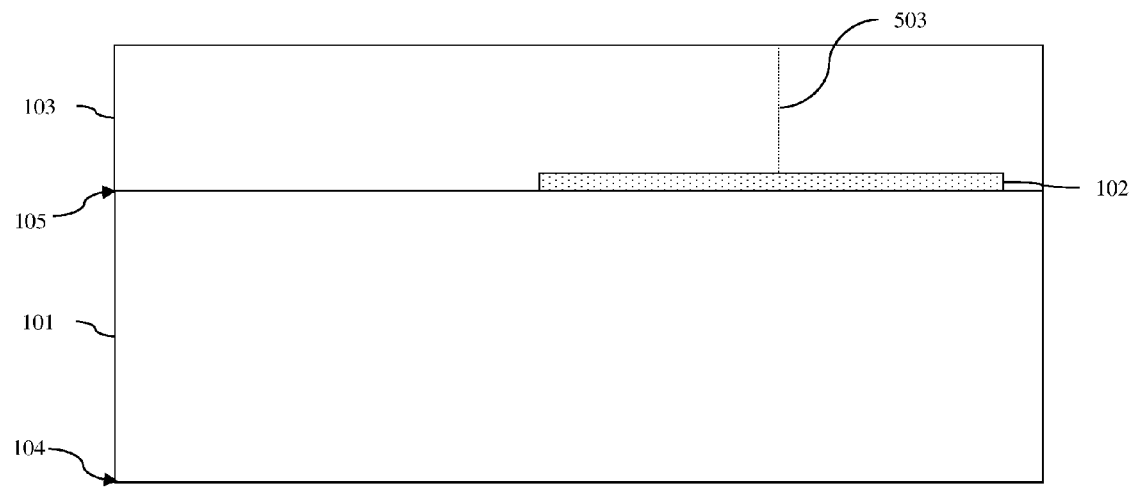
FIG. 5 is a cross-section diagram illustrating a partially completed lateral double-diffused metal oxide semiconductor field effect transistor formed according to the method of FIG. 2.

Next, a semiconductor layer 103 can be formed (e.g., epitaxially deposited) on the top surface 105 of the semiconductor substrate 101 such that it is positioned laterally adjacent to the etch stop pad 102 and such that it further extends over and covers the etch stop pad 102 (206, see FIG. 5). This semiconductor layer 103 can comprise, for example, the same semiconductor material as in the semiconductor substrate 101 or, alternatively, a different semiconductor material than that of the semiconductor substrate 101. Thus, for example, if the semiconductor substrate 101 comprises a silicon substrate, the semiconductor layer 103 can comprise a silicon layer or, alternatively, a silicon germanium layer, a silicon carbide layer, a silicon germanium carbide layer, or any other suitable semiconductor layer. As mentioned above, this semiconductor layer 103 can be formed on the semiconductor substrate 101 and over the etch stop pad 102 by epitaxial deposition. Those skilled in the art will recognize that, due to the epitaxial deposition process used, the semiconductor material may grow laterally over the etch stop pad 102 from opposing sides of that etch stop pad 102 (e.g., when the etch stop pad 102 comprises a dielectric material), thereby creating a seam 503 above the center of the etch stop pad 102. Additionally, due to the epitaxial deposition process used, different sections of the semiconductor layer 103 may have different crystalline structures depending upon the crystalline structures of the semiconductor substrate 101 and the etch stop pad 102. For example, if the semiconductor substrate 101 comprises a monocrystalline silicon substrate and the etch stop pad 102 comprises a dielectric pad, the resulting semiconductor layer 103 may have monocrystalline and polycrystalline sections above the monocrystalline silicon substrate 101 and etch stop pad 102, respectively. However, if the semiconductor substrate 101 comprises a monocrystalline silicon substrate and the etch stop pad comprises a monocrystalline silicon germanium pad, the semiconductor layer 103 may be entirely monocrystalline.

Figure 6:
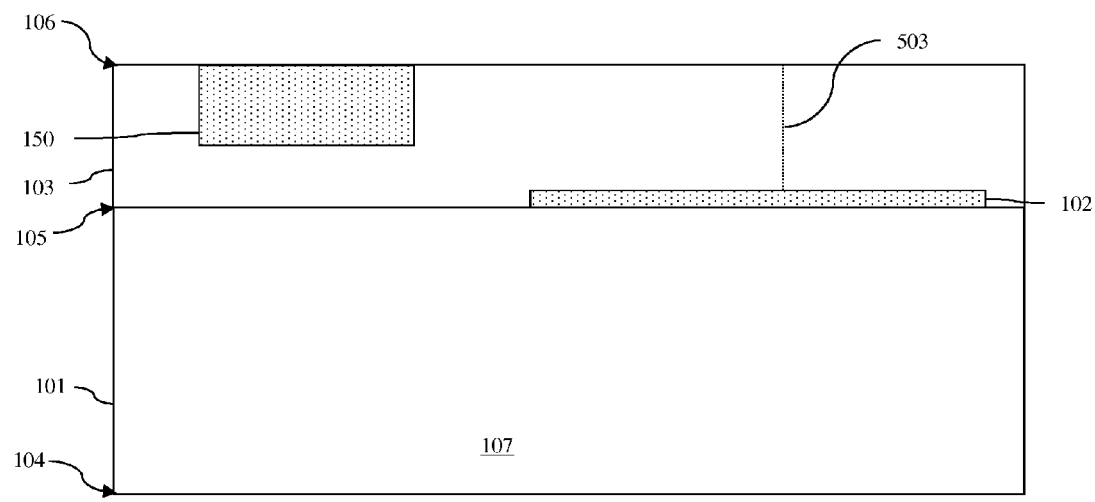
FIG. 6 is a cross-section diagram illustrating a partially completed lateral double-diffused metal oxide semiconductor field effect transistor formed according to the method of FIG. 2.

Optionally, a trench isolation region 150 can be formed at the top surface 106 of the semiconductor layer 103 offset from the etch stop pad (208, see FIG. 6). The trench isolation region 150 can be formed using conventional shallow trench isolation region formation techniques. That is, a trench can be lithographically patterned and etched into the top surface of the semiconductor layer 103 and then filled with one or more isolation materials (e.g., silicon dioxide, silicon nitride, silicon oxynitride, and/or any other suitable isolation material).

Figure 7:
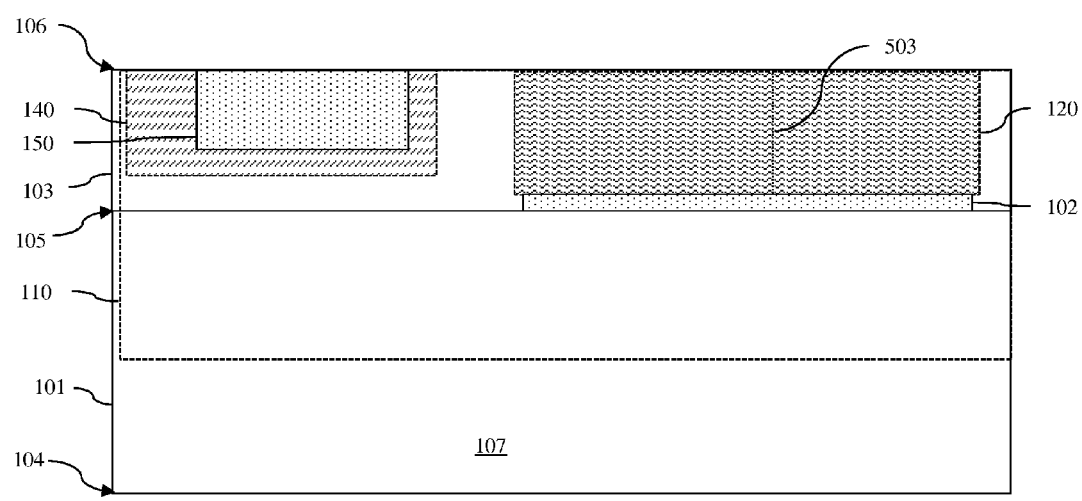
FIG. 7 is a cross-section diagram illustrating a partially completed lateral double-diffused metal oxide semiconductor field effect transistor formed according to the method of FIG. 2.

Then, multiple well regions (also referred to herein as dopant implant regions) can be formed (210, see FIG. 7). Specifically, a first well region 110, a second well region 120 and a third well region 140 can be formed, for example, using conventional ion implantation processes. Ion implantation processes are well known in the art and, thus, the details have been omitted from this specification in order to allow the reader to focus on the salient aspects of the disclosed method. However, those skilled in the art will recognize that typically, during an ion implantation process, a mask layer is formed on a wafer and patterned with one or more openings to defined area(s) of the wafer to be doped with a dopant. Then, charged ions (i.e., the dopant) are accelerated in an electric field and implanted into the area(s) of the wafer defined by the patterned mask layer. Generally, the dopant profile (including the depth) and the resulting dopant concentration of the resulting dopant implant region are dependent upon the implantation energy and time.

In any case, at least a first ion implantation process can be performed in order to form a first well region 110 that is doped with a second type dopant (e.g., an N-type dopant) so as to have a second type conductivity (e.g., N-type conductivity), which is different from the first type conductivity (e.g., such that the first well region 110 comprises an N-well region) (211). This first ion implantation process can further be performed such that the first well region 110 extends from the top surface 106 of the semiconductor layer 103 to a predetermined depth within the semiconductor substrate 101 and such that it contains the etch stop pad 102. It should be noted that the predetermined depth of the first well region 110 within the semiconductor substrate 101 can be some distance above the bottom surface 104 of the semiconductor substrate 101 such that a lower portion 107 of the semiconductor substrate 101, having the first type conductivity (e.g., P-type conductivity), remains between the bottom surface 104 of the semiconductor substrate 101 and the first well region 110.

A second ion implantation process can further be performed in order to form a second well region 120 that is doped with a first type dopant (e.g., a P-type dopant) so as to have the first type conductivity (e.g., P-type conductivity) at a higher conductivity level than the semiconductor substrate 101 (e.g., such that the second well region 120 comprises a P-well region) (212). The first type dopant used in this second ion implantation process can be the same first type dopant used to dope the semiconductor substrate or a different first type dopant. This second ion implantation process can further be performed such that the second well region 120 is within first well region 110, extends from the top surface 106 of the semiconductor layer 103 to a predetermined depth within the semiconductor layer 103, is aligned above the etch stop pad 102 and has approximately the same area (i.e., length and width) as the etch stop pad 102.

A third ion implantation process can further be performed in order to form a third well region 140 and, particularly, a defined drain drift region, which is in the first well region 110 and which is doped with a second type dopant (e.g., an N-type dopant) so as to have the second type conductivity (e.g., N-type conductivity) but at a higher conductivity level than the first well region 110 (213). This second type dopant can be either the same second type dopant or a different second type dopant than that used in the first well region 110. The third ion implantation process can further be performed such that the third well region 140 is at the top surface 106 of the semiconductor layer 103, contains and is deeper than the optional trench isolation region 150 (if formed at process 208), and extends laterally toward, without abutting, the second well region 120.

Figure 8:
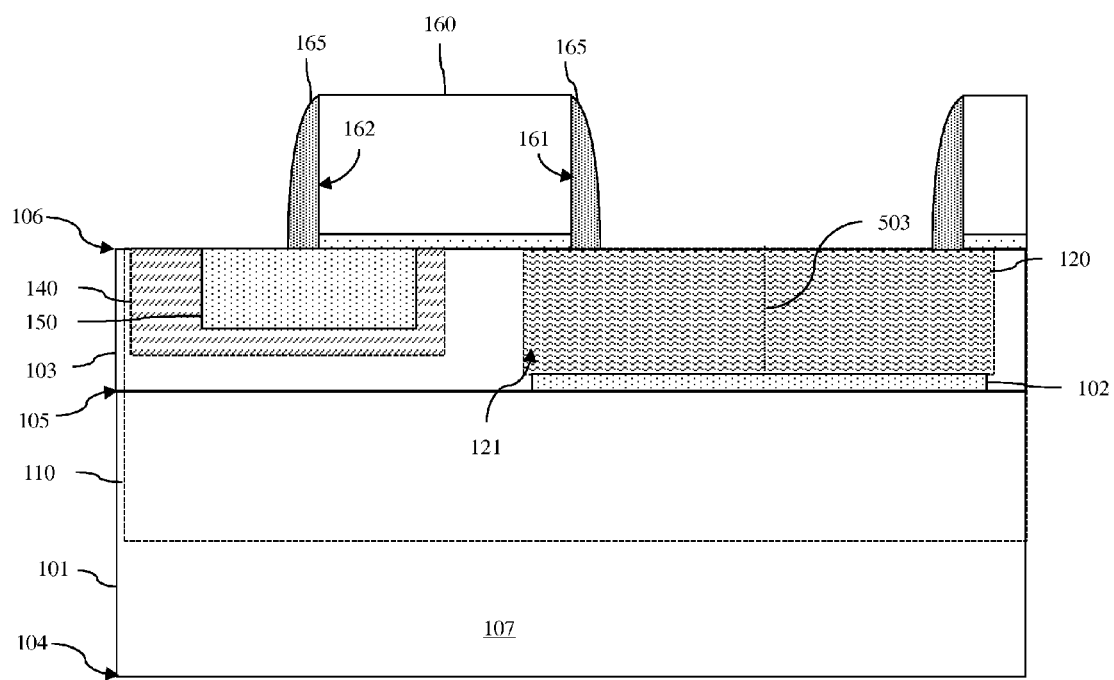
FIG. 8 is a cross-section diagram illustrating a partially completed lateral double-diffused metal oxide semiconductor field effect transistor formed according to the method of FIG. 2.

Next, a gate structure 160 can be formed on the top surface 106 of the semiconductor layer 103 (214, see FIG. 8). For example, a gate dielectric layer can be deposited onto the top surface 106 of the semiconductor layer 103 and a gate conductor layer can be deposited onto the gate dielectric layer, thereby forming a gate stack. The gate stack can subsequently be lithographically patterned and etch such that the resulting gate structure 160 is above the first well region 110 with a first side (e.g., see first sidewall 161) that overlaps an edge portion 121 of the second well region 120 and a second side (e.g., see second sidewall 162) that overlaps the third well region 140 and the optional trench isolation region 150 (if formed at process 208). It should be understood that, although a single gate dielectric layer and a single gate conductor layer are illustrated as being formed at process 214, the gate dielectric layer can comprise one or more gate dielectric materials and the gate conductor layer can comprise one or more different gate conductor materials. See detailed discussion above with regard to the structure embodiment for the various different gate dielectric and gate conductor materials that could be used to form the gate structure 160. In any case, after the gate structure 160 is formed, gate sidewall spacers 165 can be formed on the opposing sidewalls of the gate structure 160 (i.e., on the first sidewall 161 and the second sidewall 162). The gate sidewall spacers 165 can comprise one or more dielectric layers comprising any of silicon dioxide, silicon nitride, silicon oxynitride, air-gaps, etc. and can be formed using conventional sidewall spacer formation techniques. For example, a dielectric layer can be deposited over the gate stack and an anisotropic etch process can be performed in order to remove the dielectric layer from horizontal surfaces of the gate stack and semiconductor layer.

Figure 9:
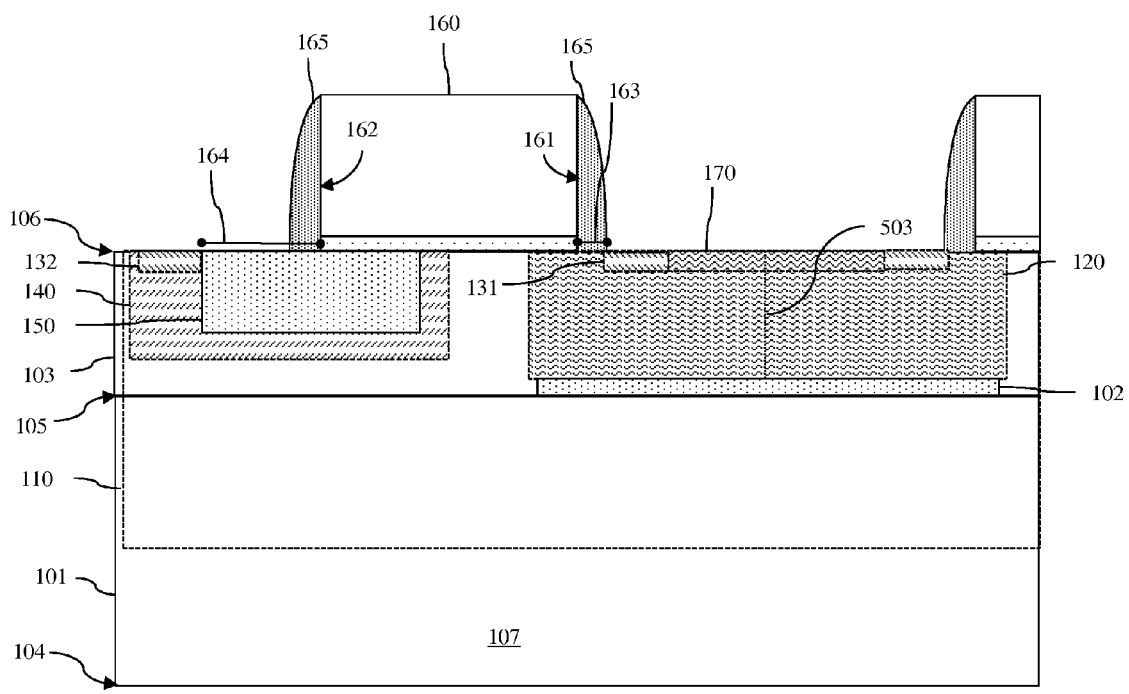
FIG. 9 is a cross-section diagram illustrating a partially completed lateral double-diffused metal oxide semiconductor field effect transistor formed according to the method of FIG. 2.

After the gate structure 160 and gate sidewall spacers 165 are formed, a source region 131 and a drain region 132 can be formed (216, see FIG. 9). Specifically, another ion implantation process or a diffusion process can be performed so that the resulting source region 131 and drain region 132 are doped with a second type dopant (e.g., a N-type dopant) so as to have the second type conductivity (e.g., the N-type conductivity) at a higher conductivity level than both the third well region 140 and the first well region 110. Due to the position of the gate structure 160 and gate sidewall spacers 165 relative to the previously formed FET components in the semiconductor layer 103 below (e.g., the second well region 120, the third well region 140 and the optional trench isolation region 150 (if formed at process 208)), the source region 131 can be formed within the first well region 110 and, particularly, within the second well region 120 contained therein at the top surface 106 of the semiconductor layer 103 adjacent to the first sidewall 161 of the gate structure and spaced a first distance 163 from the first sidewall 161. This first distance 163 can be approximately equal to the width of the gate sidewall spacers 165. Thus, the source region 131 will be aligned above the etch stop pad 102. Additionally, the drain region 132 can be formed within the first well region 110 and, particularly, within the third well region 140 contained therein at the top surface 106 of the semiconductor layer 103 adjacent to the second sidewall 162 of the gate structure 160 opposite the first sidewall 161. The drain region 132 can further be spaced a second distance 164 from the second sidewall 162. This second distance 164 can be greater than the first distance 163 and can be a function, for example, of the position of the second sidewall 162 above the trench isolation region 150 (e.g., can be equal to the length of the portion of the trench isolation region 150 that extends laterally beyond the second sidewall 162).

Either before or after the source region 131 and drain region 132 are formed, a contact region 170 can be formed (218, see also FIG. 9). Specifically, yet another ion implantation or a diffusion process can be performed so that the resulting contact region 170 is doped with a first type dopant (e.g., a P-type dopant) so as to have the first type conductivity (e.g., the P-type conductivity) at a higher conductivity level than the second well region 120 (e.g., such that the contact region 170 comprises a P+ contact region). This ion implantation or diffusion process can specifically be performed so that the contact region 170 is within the second well region 120 at the top surface 106 of the semiconductor layer 103 and so that the source region 131 is positioned laterally between the contact region 170 and the gate structure 160. Thus, the contact region 170 will be aligned above the etch stop pad 102.

Subsequently, a buried isolation region 190 can be formed within the first well region 110 such that it is aligned below the etch stop pad 102 (220, see FIGS. 10-12 and 1).

Figure 10:
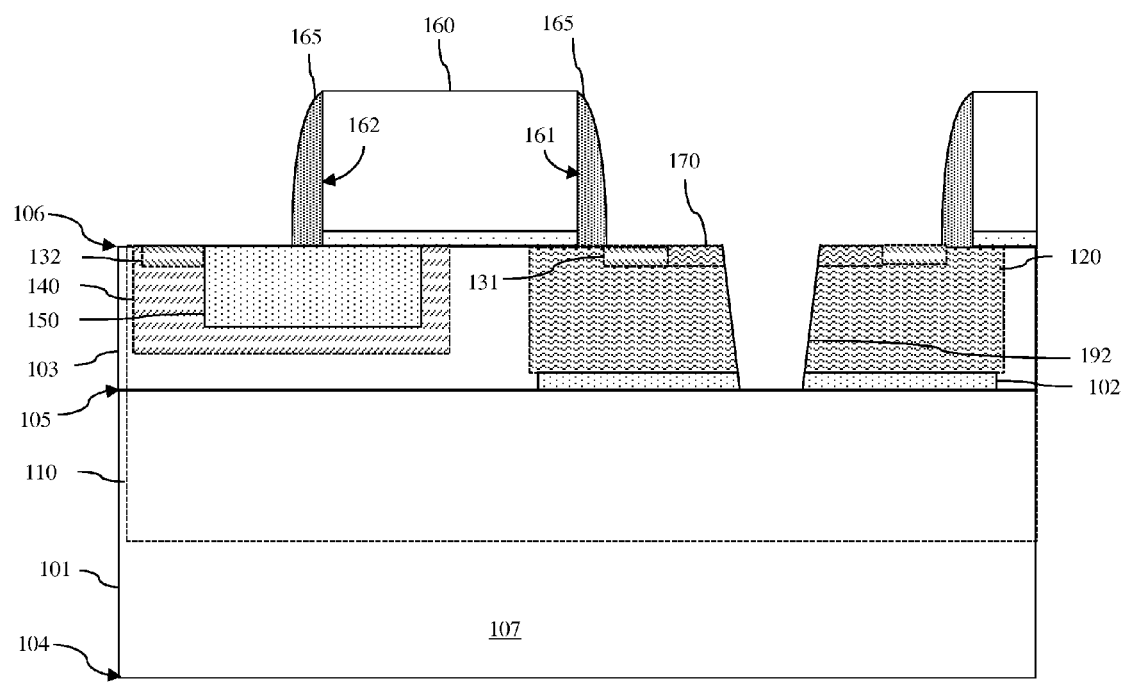
FIG. 10 is a cross-section diagram illustrating a partially completed lateral double-diffused metal oxide semiconductor field effect transistor formed according to the method of FIG. 2.

More specifically, to form a buried isolation region 190 within the first well region 110 and aligned below the etch stop pad 102, an opening 192 can be lithographically patterned and etched such that it extends from the top surface 106 of the semiconductor layer 103 through the second well region 120 and etch stop pad 102 to the top surface 105 of the semiconductor substrate 101 (221, see FIG. 10). Ideally, this opening should be patterned and etched such that it removes any seam 503 created during epitaxial deposition of the semiconductor layer 103 at process 206. Depending upon the etch processes used to form the opening 192, the walls of the opening 192 may be essentially perpendicular to the top surface 105 of the semiconductor substrate 101 such that the width of the opening 192 is essentially uniform or, alternatively, the walls may be angled relative to the top surface 105 of the semiconductor substrate 101 such that the width of the opening 192 is tapered (i.e., narrower at the bottom, as illustrated).

Figure 11:
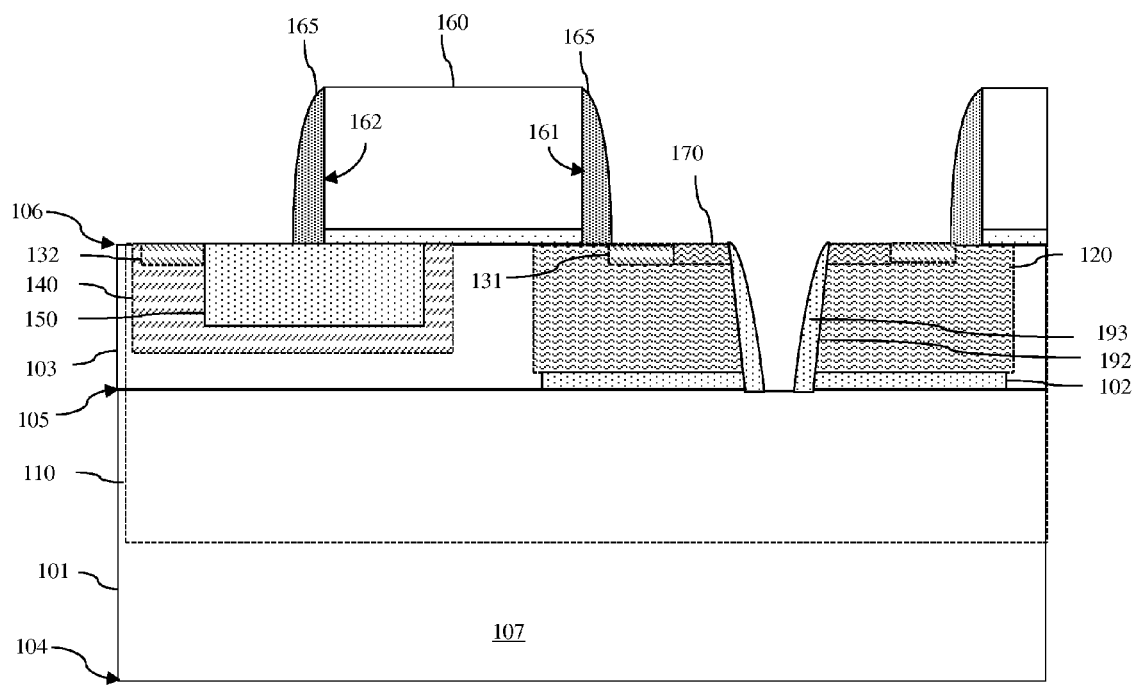
FIG. 11 is a cross-section diagram illustrating a partially completed lateral double-diffused metal oxide semiconductor field effect transistor formed according to the method of FIG. 2; and, FIG. 12 is a cross-section diagram illustrating a partially completed lateral double-diffused metal oxide semiconductor field effect transistor formed according to the method of FIG. 2.

In any case, a protective liner 193 (e.g., a silicon dioxide liner, silicon nitride liner, a polymer liner, or any other suitable protective liner) can then be formed so as to line the walls only of the opening 192, exposing a portion of the top surface 105 of the semiconductor substrate 101 at the bottom of the opening 192 (222, see FIG. 11). This protective liner 193 can be formed, for example, by depositing a conformal protective layer (e.g., a conformal silicon dioxide layer, a conformal silicon nitride layer, a conformal polymer layer, etc.) and performing an anisotropic etch process to remove the conformal protective layer from horizontal surfaces only, thereby exposing the portion of the top surface 105 of the semiconductor substrate 101 at the bottom of the opening 192 and leaving the walls of the opening covered. Although not illustrated, it should be understood that this protective liner 193 will also remain on vertical surfaces of the gate sidewall spacers 165.

Figure 12:
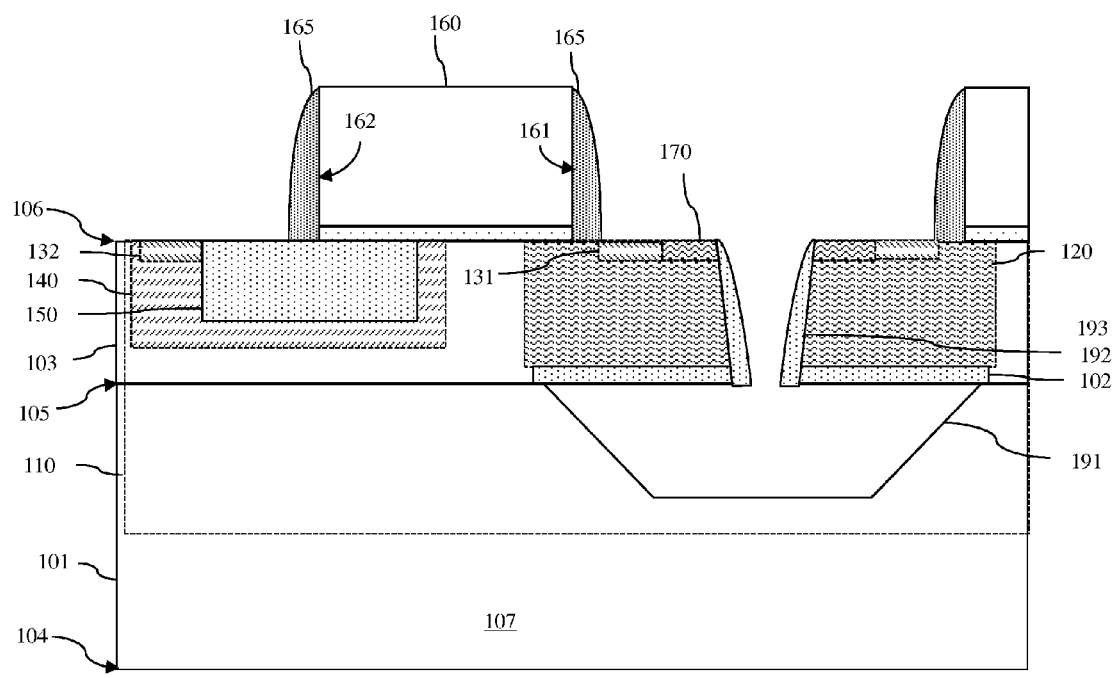

Next, the exposed surface of the semiconductor substrate 101 at the bottom of the opening 192 can be etched so as to form a cavity 191 that undercuts the etch stop pad 102 (223, see FIG. 12). Specifically, an etch process can be performed that selectively etches the exposed surface of the semiconductor substrate 101 at the bottom of the opening 192 such that the resulting cavity 191 within the semiconductor substrate 101 is centered below and wider than the opening 192 and, thereby aligned below the etch stop pad 102. This etching process should be timed such that it is stopped before the cavity 191 extends laterally beyond the outer edges of the etch stop pad 102.

Those skilled in the art will recognize that in order to achieve the desired etch selectively, the specifications used for the etch process (e.g., the etchant used and type of etch process performed) may vary depending upon the materials used for the semiconductor substrate and for the etch stop pad. For example, if the semiconductor substrate 101 comprises a silicon substrate and the etch stop pad 102 comprises a silicon dioxide pad, the cavity 191 can be formed by performing a wet chemical etch process using, for example, any of the following wet etchants that will selectively etch silicon over silicon dioxide: tetramethylammonium hydroxide (TMAH), ammonium hydroxide ($NH_4OH$), sodium hydroxide (NaOH), or potassium hydroxide (KOH). Alternatively, if the semiconductor substrate 101 comprises a silicon substrate and the etch stop pad 102 comprises a silicon dioxide pad, the cavity 191 can be formed by performing a vapor etch process using, for example, Xenon difluoride ($XeF_2$), to selectively silicon over silicon dioxide. In another example, if the semiconductor substrate 101 comprises a silicon substrate and the etch stop pad 102 comprises a silicon germanium pad, the cavity 191 can be formed by performing a wet chemical etch process using, for example, any of the following wet etchants that will selectively etch silicon over silicon germanium: tetramethylammonium hydroxide (TMAH), ammonium hydroxide ($NH_4OH$), ethylenediamine pyrocatechol (EDP), or potassium hydroxide (KOH).

It should also be noted that, depending upon the etchant used, the profile of the sidewalls of the cavity 191 may vary. For example, the sidewalls of the cavity may be perpendicular to the top surface 105 of the semiconductor substrate 101, curved, or angled (as illustrated). Angled walls are typically the result of an etch process, such as a wet chemical etch process, wherein etch selectivity is also exhibited for one crystalline orientation over another.

After the cavity 191 is formed, one or more isolation layers 194 can be deposited over the structure to at least plug the opening 192, thereby forming the buried isolation region 190 within the cavity 191 (224, see FIG. 1). Specifically, the isolation layer(s) 194 can comprise one or more of layers of silicon dioxide, silicon nitride, silicon oxynitride, borophosphosilicate glass (BPSG), etc. The isolation layer(s) 194 can fill both the cavity 191 and opening 192. Alternatively, as illustrated, the isolation layer(s) 194 can pinch off in the opening 192, thereby plugging the opening 192 and leaving the cavity 191 filled with air alone (as illustrated) or a combination of air and isolation layer(s) such that the resulting buried isolation region 190 comprises a buried air-gap isolation region. In any case, this buried isolation region 190 limits vertical capacitor formation (e.g., vertical PNP capacitor formation) between the second well region 120, the first well region 110 and the lower portion 107 of the semiconductor substrate 101 and, thereby reduces parasitic capacitance that can result in power loss during switching.

After the opening 192 is plugged, additional conventional field effect transistor (FET) processing can be performed in order to complete the FET 100 structure (226). This additional processing can include, but is not limited to, interlayer dielectric deposition, contact formation, etc. Such FET processing is well known in the art and, thus, the details are omitted from this specification in order to allow the reader to focus on the salient aspects of the disclosed method.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed field effect transistors and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/ or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above is a field effect transistor (FET) (e.g., a lateral double-diffused metal oxide semiconductor field effect transistor (LDMOSFET)). The FET can comprise an etch stop pad on a semiconductor substrate (e.g., a P-type silicon substrate). A semiconductor layer (e.g., a silicon layer) can also be on the semiconductor substrate and can extend laterally over the etch stop pad. A first well region (e.g., an N-well region) can extend through the semiconductor layer into the semiconductor substrate such that it contains the etch stop pad. A second well region (e.g., a P-well region) can be in the first well region aligned above the etch stop pad. A source region (e.g., a N-type source region) can be in the second well region at the top surface of the semiconductor layer. A buried isolation region (e.g., a buried air-gap isolation region) can be positioned within the lower portion of the first well region in the semiconductor substrate and, specifically, can be aligned just below the etch stop pad in order to limit vertical capacitor formation (e.g., vertical PNP capacitor formation) between the second well region, the first well region and the semiconductor substrate and, thereby reduce parasitic capacitance. Also disclosed above is a method of forming the FET.

What is claimed is:

1. A field effect transistor comprising:
   a semiconductor substrate having a first type conductivity;
   an etch stop pad on said semiconductor substrate;
   a semiconductor layer on said semiconductor substrate positioned laterally immediately adjacent to said etch stop pad and further extending over said etch stop pad;
   a first well region extending from a top surface of said semiconductor layer into said semiconductor substrate such that said etch stop pad is contained within said first well region, said first well region having a second type conductivity different from said first type conductivity;
   a second well region within said first well region at said top surface of said semiconductor layer and aligned above said etch stop pad, said second well region having said first type conductivity;
   a source region within said second well region at said top surface of said semiconductor layer;
   a drain region within said first well region at said top surface of said semiconductor layer and separated from said second well region, said source region and said drain region each having said second type conductivity; and,
   a buried isolation region within said first well region aligned below said etch stop pad.

2. The field effect transistor of claim 1, said etch stop pad comprising any of a silicon dioxide pad, a silicon nitride pad, and a silicon germanium pad.

3. The field effect transistor of claim 1, said buried isolation region comprising a buried air-gap isolation region comprising a cavity filled with any one of air alone and a combination of air and at least one isolation layer.

4. The field effect transistor of claim 1, further comprising:
   an opening extending from a top surface of said semiconductor layer through said second well region and said etch stop pad to said buried isolation region, said opening having walls;
   a protective liner lining said walls; and,
   an isolation layer plugging said opening.

5. The field effect transistor of claim 1, further comprising a gate structure on said top surface of said semiconductor layer between said source region and said drain region, said gate structure having a first sidewall and a second sidewall opposite said first sidewall, said first sidewall being a first distance from said source region and said second sidewall being a second distance from said drain region, said second distance being greater than said first distance.

6. The field effect transistor of claim 5, further comprising:
a third well region in said first well region at said top surface of said semiconductor layer, containing said drain region and extending laterally below said gate structure toward said second well region, said third well region having said second type conductivity at a lower conductivity level than said drain region and at a higher conductivity level than said first well region; and,
a trench isolation region in said third well region at said top surface of said semiconductor layer, said trench isolation region being positioned immediately adjacent to said drain region and extending laterally below said gate structure toward said second well region.

7. A field effect transistor comprising:
a silicon substrate having a P-type conductivity;
an etch stop pad on said silicon substrate;
a silicon layer on said silicon substrate positioned laterally immediately adjacent to said etch stop pad and further extending over said etch stop pad;
a first well region extending from a top surface of said silicon layer into said silicon substrate such that said etch stop pad is contained within said first well region, said first well region having a N-type conductivity;
a second well region within said first well region at said top surface of said silicon layer and aligned above said etch stop pad, said second well region having said P-type conductivity;
a source region within said second well region at said top surface of said silicon layer;
a drain region within said first well region at said top surface of said silicon layer and separated from said second well region, said source region and said drain region each having said N-type conductivity; and,
a buried isolation region within said first well region aligned below said etch stop pad.

8. The field effect transistor of claim 7, said etch stop pad comprising any of a silicon dioxide pad, a silicon nitride pad, and a silicon germanium pad.

9. The field effect transistor of claim 7, said buried isolation region comprising a buried air-gap isolation region comprising a cavity filled with any one of air alone and a combination of air and at least one isolation layer.

10. The field effect transistor of claim 7, further comprising:
an opening extending from a top surface of said silicon layer through said second well region and said etch stop pad to said buried isolation region, said opening having walls;
a protective liner lining said walls; and,
an isolation layer plugging said opening.

11. The field effect transistor of claim 7, further comprising a gate structure on said top surface of said silicon layer between said source region and said drain region, said gate structure having a first sidewall and a second sidewall opposite said first sidewall, said first sidewall being a first distance from said source region and said second sidewall being a second distance from said drain region, said second distance being greater than said first distance.

12. The field effect transistor of claim 11, further comprising:
a third well region in said first well region at said top surface of said silicon layer, containing said drain region and extending laterally below said gate structure toward said second well region, said third well region having said N-type conductivity at a lower conductivity level than said drain region and at a higher conductivity level than said first well region; and,
a trench isolation region in said third well region at said top surface of said silicon layer, said trench isolation region being positioned immediately adjacent to said drain region and extending laterally below said gate structure toward said second well region.

13. A method of forming a field effect transistor, said method comprising:
forming an etch stop pad on a semiconductor substrate having a first type conductivity;
forming a semiconductor layer on said semiconductor substrate positioned laterally adjacent to said etch stop pad and further extending over said etch stop pad;
forming a first well region extending from a top surface of said semiconductor layer into said semiconductor substrate such that said first well region has a second type conductivity different from said first type conductivity and such that said first well region contains said etch stop pad;
forming a second well region within said first well region at said top surface of said semiconductor layer and aligned above said etch stop pad, said second well region having said first type conductivity;
forming a gate structure on a top surface of said semiconductor layer above said first well region and overlapping an edge portion of said second well region;
forming a source region and a drain region each having said second type conductivity, said source region being formed within said second well region at said top surface of said semiconductor layer adjacent to a first sidewall of said gate structure and said drain region being formed within said first well region at said top surface of said semiconductor layer adjacent to a second sidewall of said gate structure opposite said first sidewall; and,
forming a buried isolation region within said first well region and aligned below said etch stop pad and said second well region.

14. The method of claim 13, said forming of said etch stop pad comprising:
depositing an etch stop layer comprising any one of a dielectric material and a semiconductor material that is different from said semiconductor substrate; and,
patterning said etch stop layer to form said etch stop pad.

15. The method of claim 13, said forming of said semiconductor layer comprising epitaxially depositing said semiconductor layer on said semiconductor substrate and over said etch stop pad.

16. The method of claim 13, said forming of said buried isolation region comprising:
forming an opening extending from said top surface of said semiconductor layer through said second well region and said etch stop pad to said semiconductor substrate;
lining walls of said opening with a protective liner;
etching said semiconductor substrate at a bottom of said opening to form a cavity below said etch stop pad, said etching being selective for said semiconductor substrate over said etch stop pad; and,
depositing an isolation layer into said opening.

17. The method of claim 16, said etching being stopped before said cavity extends laterally beyond said etch stop pad.

18. The method of claim 16, said isolation layer plugging said opening without entirely filling said cavity such that said buried isolation region comprises a buried air-gap isolation region comprising said cavity filled with any one of air alone and a combination of air and said isolation layer.

19. The method of claim 13, said gate structure and said source region and said drain region being formed such that said first sidewall of said gate structure is a first distance from said source region and such that said second sidewall of said gate structure is a second distance from said drain region, said second distance being greater than said first distance.

20. The method of claim 13, further comprising:
forming, at said top surface of said semiconductor layer, a trench isolation region; and,
forming a third well region in said first well region around said trench isolation region,
said drain region subsequently being formed within said third well region such that said trench isolation region is positioned laterally between said drain region and said second well region,
said gate structure subsequently being formed on said top surface of said semiconductor layer with said first sidewall above said second well region and said second sidewall above said trench isolation region, and
said first well region, said third well region and said drain region being formed so as to have said second type conductivity and so that said third well region has a higher conductivity level than said first well region and a lower conductivity level than said drain region.

\* \* \* \* \*